United States Patent [19]

Dahlberg

[11] 4,377,564
[45] Mar. 22, 1983

[54] METHOD OF PRODUCING SILICON

[75] Inventor: Reinhard Dahlberg, Flein, Fed. Rep. of Germany

[73] Assignee: Licentia Patent-Verwaltungs-GmbH, Frankfurt am Main, Fed. Rep. of Germany

[21] Appl. No.: 253,557

[22] Filed: Apr. 13, 1981

[30] Foreign Application Priority Data

May 2, 1980 [DE] Fed. Rep. of Germany ....... 3016807

[51] Int. Cl.$^3$ ............................................. C01B 33/02
[52] U.S. Cl. .................................... 423/349; 423/350; 204/164; 427/34
[58] Field of Search ....................... 423/448, 449, 450; 204/164; 427/34; 264/81

[56] References Cited

U.S. PATENT DOCUMENTS

| | | | |
|---|---|---|---|
| 3,979,500 | 9/1976 | Sheppard et al. | 423/440 X |
| 4,003,770 | 1/1977 | Janowiecki et al. | 427/34 X |
| 4,058,418 | 11/1977 | Lindmayer | 148/1.5 |
| 4,068,020 | 1/1978 | Reuschel | 423/350 X |
| 4,102,764 | 7/1978 | Harvey et al. | 423/350 X |
| 4,102,766 | 7/1978 | Fey | 423/350 X |
| 4,102,767 | 7/1978 | Mazelsky | 423/350 X |
| 4,102,985 | 7/1978 | Harvey | 423/350 X |

FOREIGN PATENT DOCUMENTS 727523 2/1966 Canada ................................ 204/164

OTHER PUBLICATIONS

Davis, L. W., "Material Progress", vol. 83, No. 3, Mar. 1963.

*Primary Examiner*—G. O. Peters
*Attorney, Agent, or Firm*—Spencer & Kaye

[57] ABSTRACT

A method of producing silicon comprising producing a plasma in a gas flow laden with at least one silicon compound so that the silicon compound is reduced or decomposed to silicon and transporting the silicon which may have reacted with other material if present in the plasma and reaction products out of the plasma in the gas flow.

43 Claims, 11 Drawing Figures

METHOD OF PRODUCING SILICON

BACKGROUND OF THE INVENTION

This invention relates to a method of producing silicon. The element silicon is being used in considerable quantities in metallurgy as an alloy additive and in its pure form is being used increasingly in the semiconductor industry. The need for silicon for producing solar cells in order to utilize the sun's energy directly will rise sharply in the future.

After oxygen, silicon is the most commonly occurring element in the Earth's crust. It is available almost everywhere—combined in quartz and silicates, but also in many other minerals.

Technically silicon is based on quartz sand which can be reduced to silicon by coal or metals such as aluminium, magnesium or sodium. This raw silicon is purified for the semiconductor industry and is converted into $SiCl_4$ at an elevated temperature, for example, with the aid of chlorine gas. $SiCl_4$ allows for further purification by means of fractional distillation.

Elemental silicon can be obtained in a very pure state in polycrystalline form, say on a hot silicon rod, by means of pyrolysis, i.e. the breakdown of a mixture for example of $H_2$ and $SiCl_4$. Due to the so-called "pulling in regions" or "crucible pulling", the polycrystalline silicon can be converted into monocrystalline rods. "Doped" monocrystalline rods of silicon, i.e., provided with intentional impurities, are chopped up into wafers. These wafers are the most important starting material for the semiconductor industry. Polycrystalline silicon wafers can also be used for silicon solar cells and their manufacturing costs are substantially lower than the manufacturing costs of monocrystalline wafers.

Even lower manufacturing costs can be expected for silicon solar cells in which only a thin film of silicon is applied to a suitable carrier, say by means of pyrolytic breakdown of a suitable silicon compound such as $SiH_4$, for example.

All of the known methods of manufacturing silicon, silicon wafers or silicon layers have two disadvantages particularly with respect to manufacturing cheap solar cells with a high degree of efficiency:

1. Sillicon wafers or layers made from sufficiently pure silicon with a good crystal quality are still relatively expensive; and
2. Sufficiently cheap wafers or layers comprising silicon are usually too poor in quality for good solar cells.

These disadvantages arise from the fact that, on the one hand, too many processing sequences are required to produce the silicon wafer or layer after the silicon has been reduced. On the other hand, the processes of purifying and reducing the polycrystalline silicon are relatively expensive. Moreover, fluid silicon is a material which requires a large outlay of energy and material and which is contaminated by almost all materials with which it comes into contact mechanically at high temperature (e.g. the crucible or the material of the substrate).

SUMMARY OF THE INVENTION

It is an object of the invention to produce pure silicon at low cost.

According to a first aspect of the invention, there is provided a method of producing silicon comprising producing a gas flow, producing a plasma in said gas flow, feeding a silicon compound into said gas flow, reducing or decomposing said silicon compound to silicon in said plasma and transporting said silicon and reaction products from said reduction or decomposition out of said plasma by means of said gas flow.

According to a second aspect of the invention, there is provided a method of producing silicon in which a gas flow is provided; a plasma is produced in said gas flow; means are provided by means of which said gas flow is laden with at least one silicon compound said silicon compound is decomposed or reduced to silicon in said plasma of said gas flow; and said silicon is transported out of said plasma by said gas flow, together with the reaction products.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
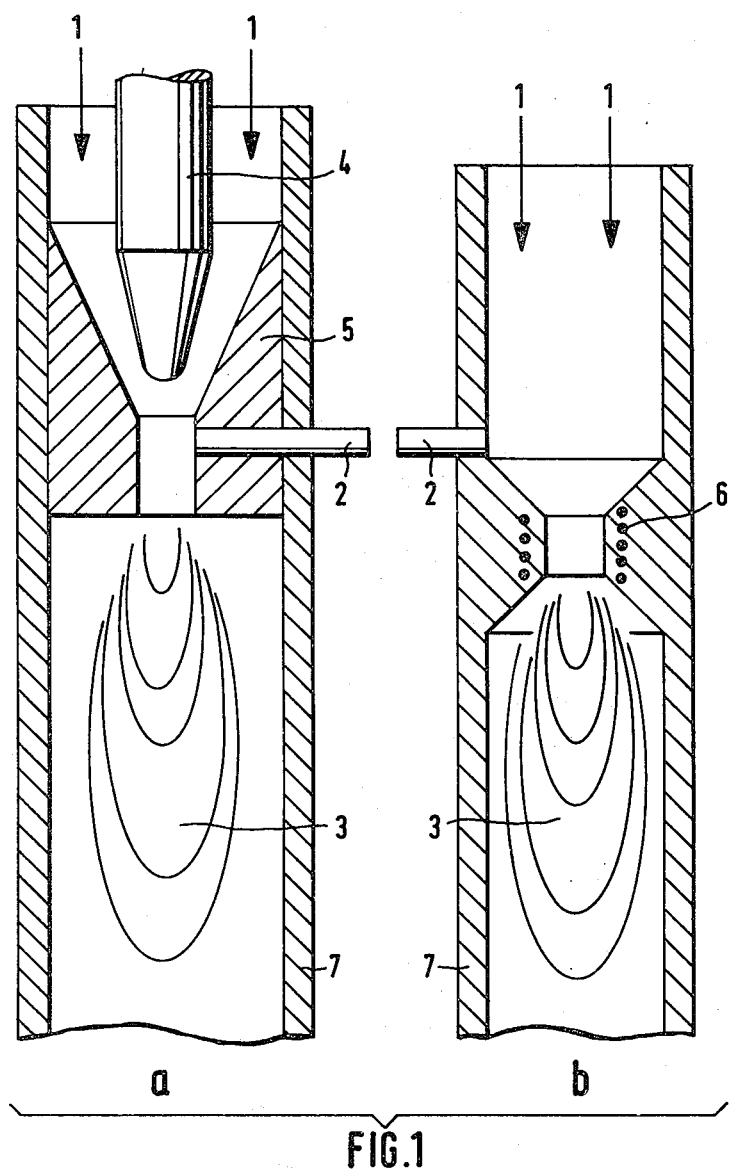
FIG. 1 illustrates the principle of manufacturing silicon with a plasma jet and with plasma induction in accordance with the invention.

Basically the invention proposes to produce silicon by providing a gas flow, by producing a plasma in this gas flow, by providing means which load the gas flow with at least one silicon compound, by breaking down or reducing the silicon compound into silicon in the plasma of the gas flow, and by transporting the silicon together with the reaction products out of the plasma by means of gas flow. The silicon transported away by gas flow can be precipitated or deposited on to a substrate as a coherent layer or as a solid crystal. However, it can also be condensed and separated as a powder.

A plasma can be produced in a gas flow for example by providing an electric arc in the gas flow between cooled electrodes. As a result, a plasma arc forms in the gas flow. The electric plasma in the gas flow can however be produced by applying a suitable electromagnetic alternating field to the gas flow. If the gas flow passes through a chamber encircled by a high-frequency coil, for example, an induction plasma can be produced in the gas flow. A plasma can also be produced by absorption of electromagnetic radiation of high intensity, e.g. laser radiation, or by very intensive ionizing radiation, e.g. α-radiation or β-radiation.

The method of producing silicon in accordance with the invention can be implemented technically in a particularly simple and convenient manner if a so-called plasma injection system is used for this (also called plasma flame, plasma spray, plasma jet or plasma powder welding system). Systems of this type for plasma spraying and plasma welding metallic and ceramic materials are obtainable on the market. With a plasma spray system with "gas-stabilized" plasma, a direct current arc is produced in a chamber between a thoriated tungesten cathode, for example, and a water-cooled nozzle as the anode, and this d.c. arc is driven through the nozzle by a gas flow—e.g., comprising $H_2$ gas. The external fast moving, envelopping layer of gas, of the gas flow keeps the arc away from the cooled wall of the nozzle while the central and slower moving hydrogen gas is converted into plasma. As the distance from the cathode increases, the plasma core of the gas flow which is flowing more slowly is mixed with the external and fast moving enveloping layer of gas and is heated additionally by the arc which is reversing its direction so that the whole of the gas flow heats up and forms a lengthened plasma. Temperatures of up to 30,000° C. are achieved in the plasma. If a metal or ceramic powder is blasted into the flow of gas, then it is heated far above its melting point and is applied at high speed to a workpiece (e.g. at a few 100 meters per second).

A constricted arc burns between a water-cooled electrode and the workpiece to be coated as the plasma powder is applied and is welded to the workpiece. The powder which is to be applied is supplied in exactly metered amounts to the arc and is melted on to the surface of the workpiece. When using plasma injection systems with "water-stabilized" plasma, extreme electrical powder levels are achieved in the plasma and outputs in terms of the amount of plasma powder applied to the workpiece are achieved which are higher by several orders of magnitude. The arc is stabilized and constricted by water. The gas flow consists of water plasma which the electric arc produces from the water itself.

Plasma injection systems of the type described can be used directly or after a relatively small modification to produce silicon in accordance with the invention.

It is already known from U.S. Pat. No. 4,003,770 of Jan. 18, 1977 to heat-up p- or n-doped silicon particles by injection in a plasma stream and to precipitate them on to a substrate in the form of a polycrystalline film. The silicon is then supplied to the plasma stream already in elemental and doped form. There is no disclosure in this patent concerning the production of elemental silicon by breaking down or reducing a silicon compound in the plasma.

The gas flow through the arc of a plasma spray system preferably comprises hydrogen, inert gas, nitrogen, halogen, hydrocarbon, carbon monoxide, water vapour or a mixture or compound of these gases in accordance with the present invention.

The silicon compound with which the gas flow is laden can be an oxygen-free compound such as $SiH_4$, $SiCl_4$, $SiHCl_3$, $SiH_2Cl_2$ for example or some other hydrogen, halogen or hydrogen/halogen compound.

It may also be an oxygen-containing compound of the silicon such as $SiO_2$ for example, a silicate or an organic or organic silicon compound. $SiO_2$ is reduced to silicon by hydrogen at temperatures of over 2000° C.

In addition to the silicon compound, a doping material for silicon can also be added to the gas flow, e.g. a doping material from the third or fifth group of the Periodic System of Elements. By adding B, Al, Ga, In or beryllium or chemical compounds of these elements such as $B_2H_6$, $AlCl_3$ etc. for example in a fixed quantity the silicon can be deposited in a p-doped manner.

Fixed additions of P, As, Sb or vanadium or compounds of these elements such as $PH_3$, $AsCl_3$, $VCl_4$ etc. for example make it possible to deposit the silicon in a n-doped manner.

The gas flow can be laden additionally with particles of silicon powder in order to increase the speed of formation of the nucleus of the reduced silicon for example or the precipitated quantity of silicon.

The gas flow can also be laden with particles of carbon powder however, in order to increase the reducing effect of the gas flow, for example.

In a preferred embodiment of the invention, the gas flow comprises hydrogen and the silicon compound from silicon tetrachloride of a halogen silane.

In another preferred embodiment, the gas flow comprises an inert gas or hydrogen and silicon hydride (silane such as $SiH_4$, $Si_2H_6$ etc.) is used as the silicon compound.

In a further preferred embodiment, the gas flow comprises hydrogen and the silicon compound is $SiO_2$, for example in powder form.

The gas flow can however comprise a mixture of inert gas with a hydrocarbon compound or a mixture of hydrogen with a hydrocarbon compound, while the silicon compound is $SiO_2$ powder or silicate powder. In addition, carbon powder particles can be added to the $SiO_2$ powder or the silicate powder.

The gas flow may also comprise inert gas, nitrogen or carbon monoxide and other chemicals (such as a metal powder) can be added to the silicon compound (e.g. $SiO_2$ or a silicate).

The silicon produced according to the invention may be deposited or precipitated on a monocrystalline silicon surface. If the temperature of the silicon surface is high enough, the deposited or precipitated silicon may grow in monocrystalline form.

The silicon can be deposited or precipitated also on a metallically conductive surface such as a metal surface or a metallically conductive layer.

The silicon can be applied to an insulator surface, e.g. ceramics, glass or organic material. Since the plasma is cooled off very quickly, then, for precipitation or deposition of the silicon, conditions can be set in which the collecting surface is not heated above 200° C.

The silicon can be precipitated on to a fluid surface which does not react chemically with the silicon such as is the case with fluid $MgCl_2$ or lead, for example, at approximately 750° C.

The silicon can even be deposited on to a heated carrier (e.g. graphite at 1000° C.) which is coated with a fluid film (e.g. NaF). Silicon layers are then achieved which are monocrystalline over fairly large areas.

In a preferred embodiment, the silicon is deposited on to a metallically conductive fluid surface or on to a metallically conductive fluid film. In particular, tin, lead, zinc, bismuth, cadmium, thallium, mercury gallium indium and antimony as well as mixtures of these elements are suitable as metals which do not react with the silicon even in the liquid phase.

When depositing the silicon on a substrate in an oxygen-free atmosphere, oxide-free silicon is obtained.

It is also advantageous to blast the plasma and the gas flow into a chamber having a very reduced pressure or a vacuum. In addition, it is possible to achieve gas speeds of up to a multiple of the speed of sound. When the silicon is deposited in oxygen-free vacuum, oxide-free solid silicon of particularly good crystal quality is produced.

The method according to the invention is suitable for manufacturing monocrystalline and polycrystalline silicon at low cost.

In addition, the method may be used for direct production of monocrystalline or polycrystalline silicon plates, wafers or layers, which are produced without any intermediate step, directly during the production of silicon.

The method is therefore particularly suitable for manufacturing or producing silicon solar cells and silicon components.

Both the n-region and the p-region and the p/n-junction of a component or of a solar cell can be produced by the method of the invention by producing the gas flow with a suitable loading of doping material. P/n-structures may therefore be produced in a continuous deposition process. P/n-junctions may also be produced however in two separate deposition processes. However, the solar cell may also be provided with a hetro junction (e.g. an $SnO_2$ layer or an $SnO_2\text{-}In_2O_3$ layer on n- or p-silicon) or with a Schottky junction for charge separation. It is also possible to produce a solar cell as an SIS structure or an MIS structure in a manner known per se.

Silicon powder may also be produced by the method in accordance with the invention if the method is implemented suitably (appropriate spacing between the arc and the collecting surface).

The silicon produced in the region of the arc may also be used in the gas flow to form a silicide which is then deposited instead of the silicon.

Silicon carbide, silicon nitride and metal silicides may be produced in the form of compact crystals, plates, wafers or layers in the form of powder.

The method of manufacturing silicon makes it possible to produce pure silicon, its degree of purity depending exclusively on the degree of purity of the gases and chemicals used. Contamination does not take place in this process.

It is particularly favourable in terms of costs because the shape of the pure silicon desired at the end (a plate, wafer or a layer) is produced in a single high-temperature process: reduction in the plasma with directly following deposition on to any desired substrate.

Above all when using powder-form silicon compounds with a relatively large grain size, the grains of the powder may pass through the high-temperature region of the plasma so rapidly that they are not heated sufficiently. This is particularly critical when reducing quartz powder in the plasma because a sufficiently fine-grain silicon oxide powder can only be fed into the gas flow in a sufficiently uniform manner with considerable difficulty.

This difficulty can be eliminated when reducing silicon oxide in the plasma of a gas flow. This is achieved by providing a plasma in a non-oxidizing gas stream, by partially introducing a moulded element into the plasma, by forming the moulded element from silicon oxide or forming the moulded element so that it contains silicon oxide, by reducing the silicon oxide to silicon in the plasma and by transporting the silicon produced away in the gas stream.

A substantial advantage of this lies in the fact that the silicon oxide may reside considerably longer in the high-temperature region of the plasma so that is is heated up sufficiently.

The silicon oxide may be introduced into the plasma in the form of a quartz rod for example, a quartz filament or a quartz tube. The inserted end vaporizes in the plasma and the rod, the filament or the tube is so advanced that a continuous process is achieved.

The silicon oxide may be introduced into the plasma either in the form of a pressed or sintered rod comprising SiO or $SiO_2$ powder.

However, a mixture of carbon or a carbon compound with silicon oxide may also be introduced into the plasma as the moulded element.

The carbon then reacts with the quartz in the high-temperature region of the plasma, e.g. in accordance with the equation:

$$SiO_2 + 2C = Si + 2CO$$

or when using a saturated hydrocarbon compound of the $C_nH_{2n+2}$ type in mixture with $SiO_2$ the latter reacts in the plasma in accordance with the equation:

$$[(2n+1)/2]\ SiO_2 + C_nH_{2n+2} = [(2n+1)/2]\ Si + nCO + (n+1)\ H_2O$$

These reactions also take place in the plasma if the gas flow comprises inert gas such as the rare or noble gases, or nitrogen. Even the water plasma $2H^+ = \overline{0}$ acts like an inert gas.

A small quantity of an element or a compound of an element from the third or fifth group of the Periodic System may be added to the silicon, oxide in order to dope the silicon, produced by reduction in the plasma.

A gas-stabilized plasma spray system or a plasma arc system may be used advantageously to produce the plasma in a non-oxidizing flow of gas. Since the electrodes of such a system are subject to wear, which would contaminate the silicon produced, it is advisable to make at least the cathode of the plasma system out of silicon.

When using a water-stabilized plasma spray system with a rotating anode, considerably greater quantities of silicon may be produced per unit time. In this case too, it is advantageous to use a cathode made from silicon instead of the graphite cathode commonly used.

If the anode (e.g. a cylindrical rotating anode) and the cathode are made from doped silicon, then they are not contaminated intolerably by the electrodes as fragments of them burn off unavoidably, if the type of conductivity of the silicon of the electrodes is the same as the type of conductivity of the silicon produced. If a highly doped silicon is used for the electrodes, then the burning-off causes intentional doping of the silicon which is being produced.

All of the inert gases, hydrogen, nitrogen, carbon monoxide, hydrocarbons, hydrogen halides, hydrogen sulphides, ammonia, water vapour and other gases as well as mixtures of these gases, for example, are suitable as gases for the non-oxidizing stream of gas in which the plasma is produced.

In order to protect the silicon, which is being produced, from oxidation by the oxygen in the air, the stream of gas together with the plasma may be enveloped in a burning covering layer of hydrocarbon or hydrocarbon gas for example.

The oxygen in the air can be kept largely away from the silicon by means of an incombustible covering layer comprising inert gas or nitrogen for example. The silicon produced is protected even more reliably from oxidation if the stream of gas is located together with the plasma in a chamber having an oxygen-free atmosphere.

It may also be advisable to allow the stream of gas together with the plasma to flow into an oxygen-free reduced pressure chamber. In addition, it is possible to freeze the partial pressure of the water vapour effectively with the aid of a low temperature valve trap.

When reducing the silicon oxide in a plasma, silicon is initially produced in vapour form and may be precipitated on to a substrate outside the plasma as a silicon layer. If the substrate itself comprises monocrystalline silicon, then monocrystalline silicon layers may be produced in this way if the temperature of the substrate is high enough. Since polycrystalline silicon layers may be produced directly from silicon oxide on any desired substrate such as metal, metallized ceramics or glass, the method described is particularly suitable for producing photovoltaic solar cells made of silicon at low cost.

Referring now to the drawings, eleven embodiments will be described:

EMBODIMENT 1

In FIG. 1, 1 is a gas flow which is laden with a silicon compound 2. The gas flow 1 is heated up and converted into plasma 3 with the aid of the direct electrical current (a)—between the cathode 4 and the anode 5—or with the aid of an alternating electrical current (b)—induced by a high-frequency coil 6. The silicon compound 2 is reduced or broken down into elemental silicon in the plasma 3. 7 is the casing of the arrangement.

EMBODIMENT 2

Figure 2:
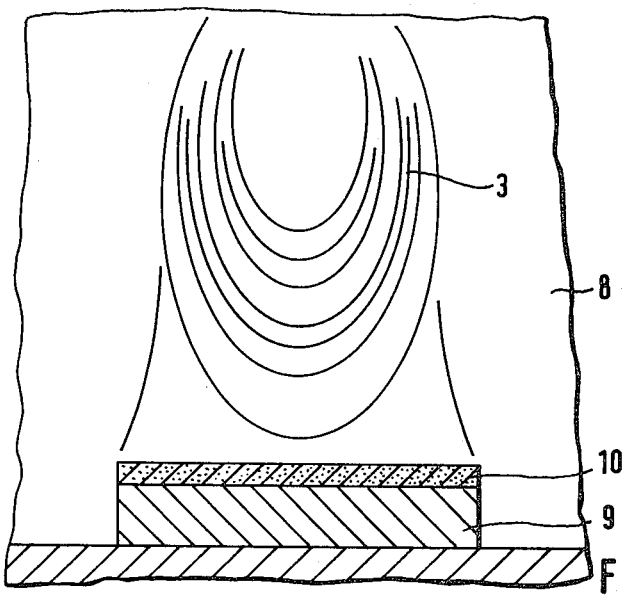
FIG. 2 illustrates the manufacture of silicon by breaking down $SiH_4$ in an induction plasma and deposition of silicon as a monocrystalline layer.

In FIG. 2, 3 is a plasma region which is produced by high-frequency heating of a stream of argon gas. The stream of argon gas is laden with silane which is broken down in the plasma 3 into elemental silicon:

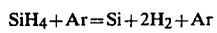

$$SiH_4 + Ar = Si + 2H_2 + Ar$$

A small quantity of phosphorus hydride is also added to the SiH$_4$ so that the silicon formed in the plasma 3 is precipitated on to the substrate 9 as an n-silicon layer 10. The substrate 9 is a monocrystalline silicon wafer which has a temperature of 900° C. and is located in a vacuum 8. The precipitated n-conductive silicon layer 10 is therefore also monocrystalline.

EMBODIMENT 3

Figure 3:
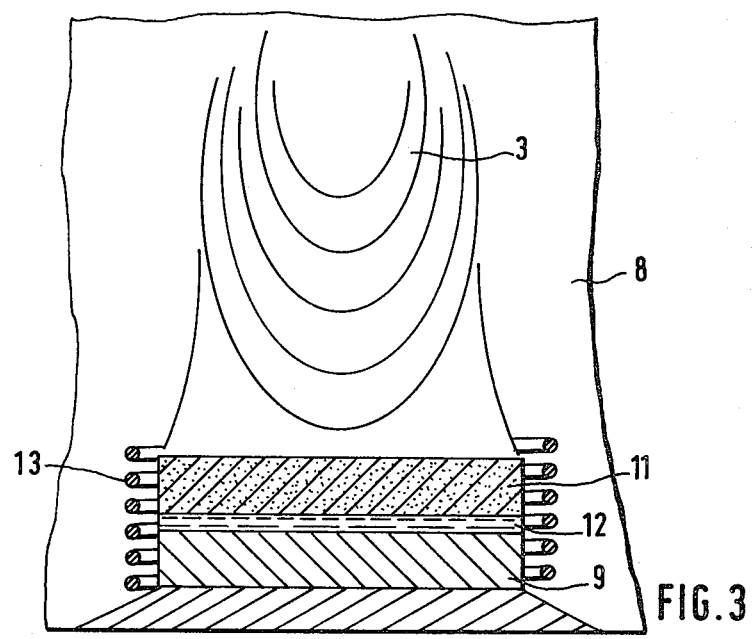
FIG. 3 shows the reduction of silicon tetrachloride in a plasma produced by a direct electrical current, said plasma producing a silicon wafer.

In FIG. 3, the plasma 3 is produced by a d.c. arc in a hydrogen flow. The hydrogen flow is laden with silicon tetrachloride so that the reaction in the plasma 3 is as follows:

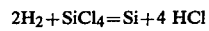

$$2H_2 + SiCl_4 = Si + 4 HCl$$

A small dose of BCl$_3$ is added to the SiCl$_4$. The substrate 9 is a carbon plate which is heated up in a vacuum 8 to a temperature of 1000° C. by a heating device 13. It is coated with a fluid film 12 comprising sodium fluoride on its surface. The silicon reduced in the plasma 3 is precipitated on to the NaF fluid film 12 in the form of a layer 11 which is p-conductive and very coarsely crystalline.

EMBODIMENT 4

Figure 4:
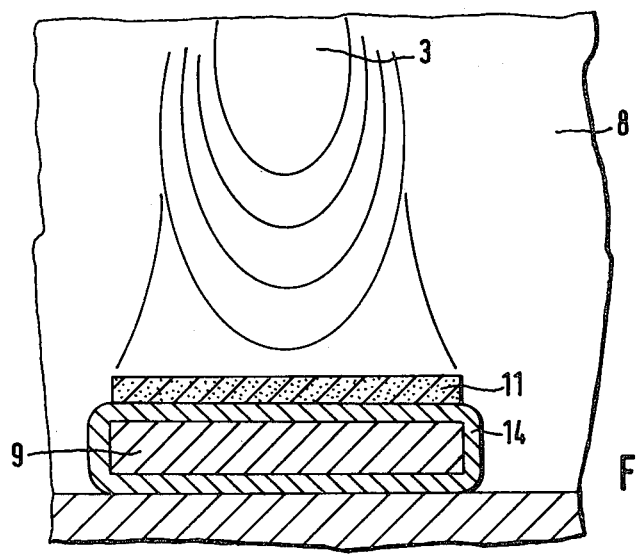
FIG. 4 illustrates the reduction of $SiO_2$ in a plasma arc for manufacturing a poly-crystalline silicon layer on an iron substrate.

In FIG. 4, the plasma 3 burns in a hydrogen flow. The hydrogen flow is laden with a mixture of quartz powder having silicon powder which is p-doped. Thre reaction in the plasma is as follows:

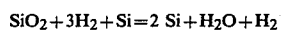

$$SiO_2 + 3H_2 + Si = 2 Si + H_2O + H_2$$

The p-silicon layer 11 is deposited in the vacuum 8 on to an iron plate 9 which is coated with a layer 14 of aluminium.

EMBODIMENT 5

Figure 5:
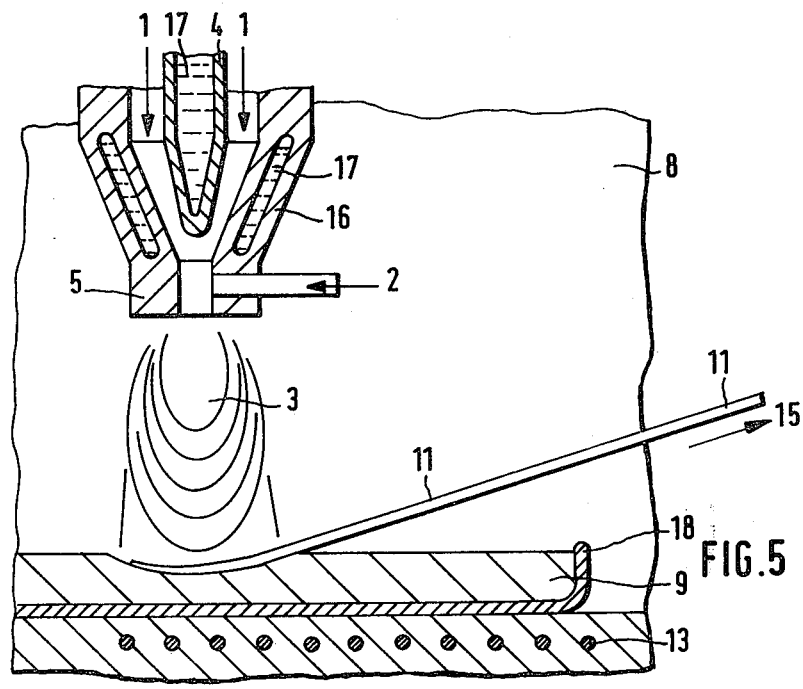
FIG. 5 illustrates plasma reduction of $SiO_2$ for producing a strip of silicon.

In FIG. 5, argon gas 1 flows through the head of a plasma spray system 16. This gas flow 1 is laden with a powder mixture 2 comprising SiO$_2$ powder with a very small proportion of B$_2$O$_3$ and graphite powder. An arc producing the plasma 3 burns in the argon gas flow 1 between the cathode 4 and the anode 5. Cathode 4 and anode 5 are water-cooled as shown at 17. The reduction of the SiO$_2$ takes place in the plasma 3 in accordance with the equation:

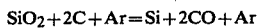

$$SiO_2 + 2C + Ar = Si + 2CO + Ar$$

The elemental silicon is precipitated in the form of a p-silicon layer 11 on to the surface 9 of molten lead as a substrate. The crucible 18 with the lead 9 is heated up to 600° C. by means of a heating device 13. The silicon layer 11 is drawn off from the lead surface 9 in the form of a strip at a constant speed 15. The CO formed during reduction of the SiO$_2$ is also collected and stored as is the argon.

EMBODIMENT 6

Figure 6:
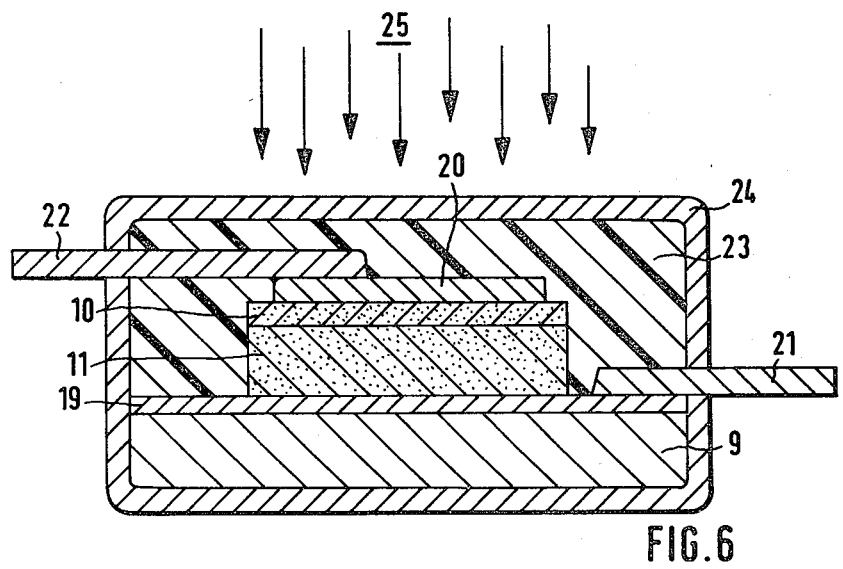
FIG. 6 shows, in cross-section, the structure of a silicon solar cell in which the silicon layers are produced by the method of the invention.

In FIG. 6, a silicon layer solar cell is shown in cross-section, its p- and n-silicon layers 11 and 10 respectively being produced according to a method of the invention. The p-silicon layer 11 is produced by reduction of very pure SiO$_2$ powder (with a fixed addition of B$_2$O$_3$) and the n-silicon layer 10 is produced by reducing very pure SiO$_2$ powder (with an addition of As$_2$O$_3$) in the plasma region of a gas flow comprising carbon monoxide in accordance with the reaction equation:

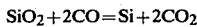

$$SiO_2 + 2CO = Si + 2CO_2$$

The p-silicon layer 11 is deposited on to a tin layer 19. The tin layer 19 (which contains 0.5% aluminium) is located on the surface of the ceramics substrate 9. During deposition of the silicon layer 11 it was fluid. The n-silicon layer 10 is provided with a structure contact layer 20 comprising zinc to which the front face contact 22 of the solar cell is welded. The rear face contact 21 of the solar cell is arranged on the tin layer 19. The solar cell is sprayed all over with a light-transmissive polycarbonate substrate 23, with the aid of a hot press process. In order to increase the resistance to weathering, the whole of the surface is sprayed with a plasma-sprayed aluminium dioxide layer 24. The photovoltage of the solar cell lies between the contacts 21 and 22 under radiation 25 from the sun.

EMBODIMENT 7

Figure 7:
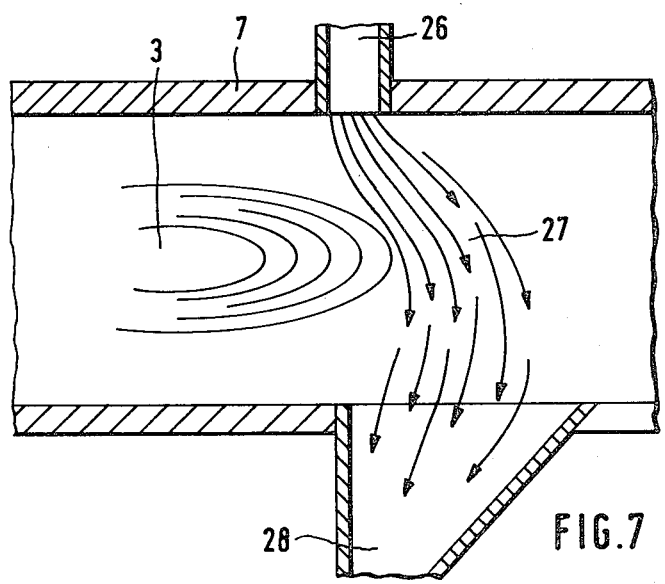
FIG. 7 illustrates the manufacture of silicon powder by reduction of quartz sand with methane in the plasma.

In FIG. 7, 7 is a casing with a square cross-section. A stream of water flows out of the nozzle 26 and forms a curtain of water 27 (filling out the cross-section) in the casing 7. A hydrogen gas plasma 3 is blasted against this curtain of water 27. In the plasma 3, reduction of very fine quartz powder takes place according to the reaction equation:

$$2H_2 + SiO_2 = Si + 2H_2O$$

The silicon produced is rinsed with the curtain of water 27 into the outflow 28 and is obtained as a powder by filtration of the water.

EMBODIMENT 8

Figure 8:
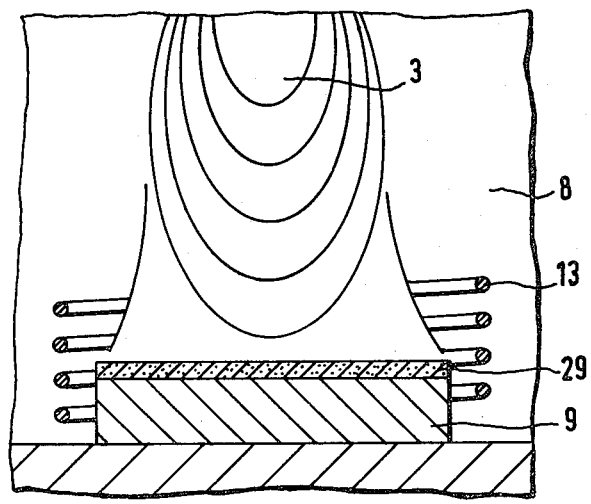
FIG. 8 shows the manufacture of silicon carbide layers which are formed from the reaction between the silicon produced in the plasma and carbon.

In FIG. 8, 3 is a plasma in an argon gas stream which is mixed with methane. This mixed stream of gas is laden with silicon tetrachloride. Initially, the following reaction takes place in the plasma:

$$SiCl_4 + CH_4 + Ar = Si + 4HCl + C + Ar$$

The elements Si and C react further under suitable conditions to form silicon carbide:

$$Si + C = SiC$$

The SiC formed in the plasma 3 is deposited as layer 29 on to a silicon substrate 9 which is heated to 1200° C. by a heating device 13. The substrate 9 is located in a chamber 8 which is evacuated.

EMBODIMENT 9

Figure 9:
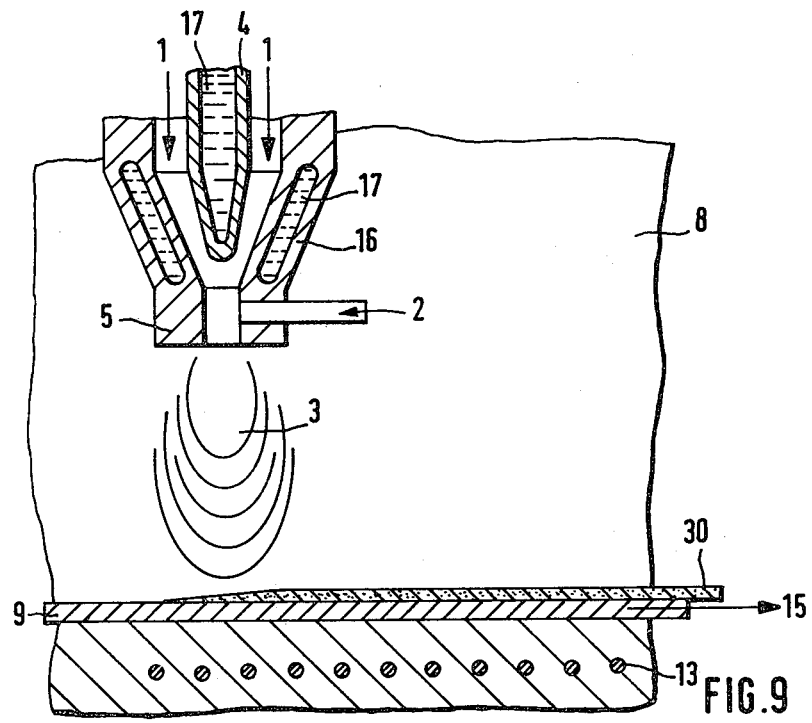
FIG. 9 illustrates the production of a layer comprising molybdenum disilicide which is formed by the reaction of the silicon produced in the plasma with molybdenum.

In FIG. 9, 16 is the spray head of a plasma spray system. 1 is a hydrogen gas flow in which an arc burns between the cathode 4 and the anode 5, the said arc producing the plasma 3. The gas flow 1 is laden with a powder-form mixture 2 comprising $SiO_2$ and $MoO_3$. 17 is the water cooling of the spray head 16. Silicon and molybdenum are formed in the plasma 3 in accordance with the equation:

$$7H_2 + 2SiO_2 + MoO_3 = 2Si + 7H_2O + Mo$$

Both elements react further under suitable conditions in the plasma to form molybdenum/disilicide:

$$2Si + Mo = MoSi_2$$

This $MoSi_2$ is deposited as layer 30 on to a ferrous strip 9 which is moved at a suitable speed 15 beneath the plasma stream 3. The ferrous strip 9 is heated to 1000° C. in the vacuum by the heating device 13.

EMBODIMENT 10

Figure 10:
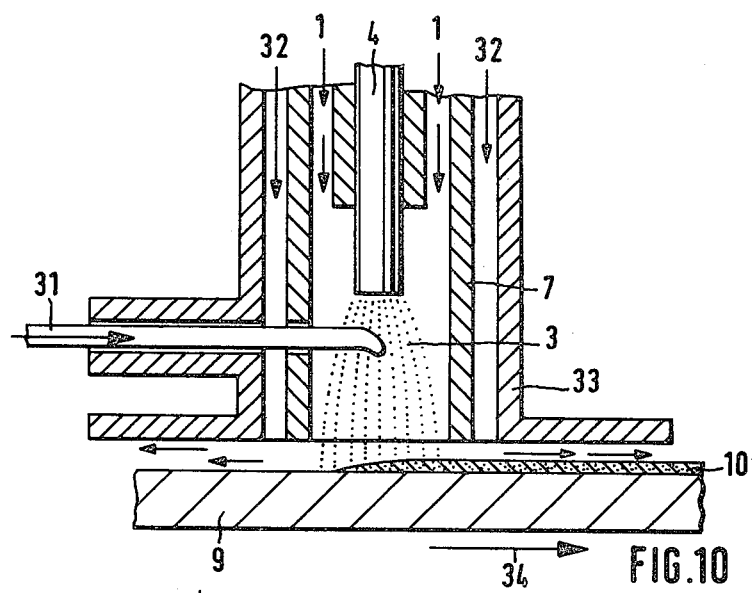
FIG. 10 shows a gas-stabilized plasma arc system in which a quartz rod is partially introduced into the plasma and the vaporized and reduced $SiO_2$, which at the same time is the anode, is precipitated in the form of a film of silicon on to a metallic structure.

FIG. 10 shows, in cross section, an arrangement in accordance with the invention having a gas-stabilized plasma welding system. 1 is a stream of gas which comprises 50% argon and 50% hydrogen. The cathode 4 comprises p-conductive silicon. It is heated during operation to such a high temperature that the conductivity of the silicon is very high (better than carbon). The plasma arc 3 burns between the cathode 4 and the anode 5. Anode 5 is the substrate at the same time, a silicon layer 10 being deposited therein. One end of a quartz rod 31 is inserted into the high-temperature region of the plasma 3. The inserted end of the quartz rod 31 ments and vaporizes. The silicon oxide vapour is reduced to silicon in the plasma by the hydrogen in the flow of gas 1 at temperatures >>2000° C. The silicon formed by this reaction is transported by the plasma snd gas stream 1 on to the anode 5 comprising a ferrous sheet and is deposited there. The anode 5 moves at a suitable speed 34 and therefore does not assume too high a temperature for condensation of the silicon. 7 is a casing for the stream of gas 1. In order to eliminate as far as possible the effect of oxygen in the air from the environment, the stream of gas 1 is surrounded by a burning envelope 32 of a buffer gas comprising propane gas. 33 is the casing of the covering layer of buffer gas 32 in cross-section. The polycrystalline silicon layer 10 deposited on to the ferrous sheet 5 as the anode is used to produce a silicon solar cell.

EMBODIMENT 11

Figure 11:
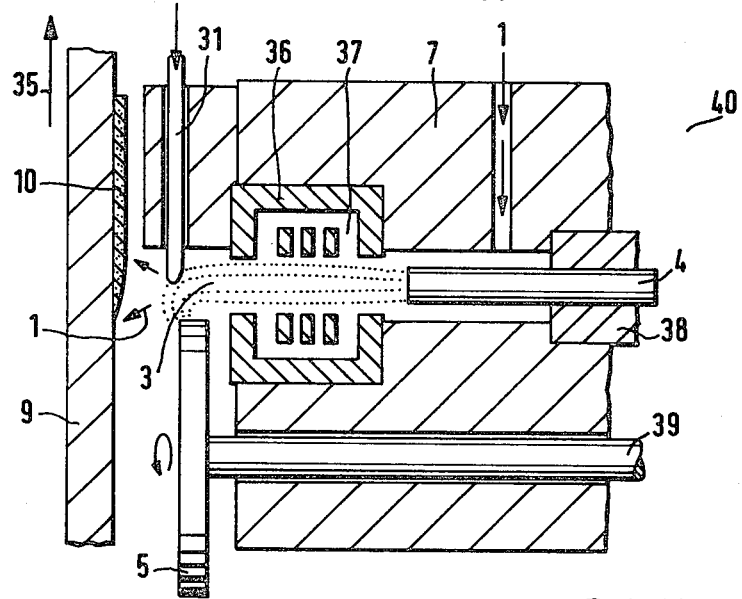
FIG. 11 shows a water-stabilized plasma spray system in which a rod comprising a pressed silicon oxide powder is introduced partially into the plasma and the said system is located in a chamber having an oxygen-free atmosphere.

FIG. 11 shows, in cross-section, a general sketch in accordance with the invention having a water-stabilized plasma spray system. 1 is a stream of hydrogen gas. 4 is a monocrystalline silicon cathode which is mounted in the water-cooled cathode connection 38. 5 is an anode rotating about an axle 39. 39 is also the current supply for the anode 5. It has the shape of a wafer and also comprises monocrystalline silicon. 3 is the plasma which draws (the silicon) from the cathode 4 to the anode 5. The plasma 3 is surrounded by water 37 in the water chamber 36 and comprises the H+ ions of the stream of gas 1 and the H+ and O-- ions comprising thermally dissociated water 37. One end of a rod 31 comprising pressed $SiO_2$ is inserted into the hot recombination region of the plasma 3 after the anode 5. The $SiO_2$ melts and vaporizes in the plasma 3 and the silicon oxide vapour is reduced to silicon by the excess hydrogen present. The silicon is transported away out of the plasma by the stream of gas 1 and is deposited in the form of a silicon layer 10 on to the metallized ceramics substrate 9. The substrate 9 is moved mechanically at a suitable speed 35 so that the deposited silicon layer 10 is applied with uniform thickness. 7 is an insulating casing of the plasma spray system. The entire arrangement is located in a chamber 40 which has an oxygen-free atmosphere. The devices for transporting away the water vapour and the excess hydrogen out of the chamber 40 are not shown in FIG. 11 and nor are the supply and outflow of the water 37 into and out of the water chamber 36.

It will be understood that the above description of the present invention is susceptible to various modification changes and adaptations.

What is claimed is:

1. A method for producing silicon comprising: providing a stream of gas; generating a plasma in said stream of gas; inserting a portion of a molded element containing silicon oxide into said plasma; reducing said silicon oxide to silicon in said plasma; and transporting the resulting silicon away in said stream of gas.

2. A method as defined in claim 1, wherein said plasma is produced by direct or alternating electric current.

3. A method as defined in claim 1, wherein said plasma is produced in said gas flow by absorption of intensive electromagnetic or ionizing radiation.

4. A method as defined in claim 1, wherein the silicon produced in said plasma is deposited on a substrate.

5. A method as defined in claim 1, wherein a plasma spray system with gas-stabilized plasma is used to produce silicon.

6. A method as defined in claim 1, wherein a plasma spray system with water-stabilized plasma is used.

7. A method as defined in claim 1, wherein said gas flow comprises a gas selected from the group consisting of hydrogen, inert gas, nitrogen, halogen, hydrocarbon, carbon monoxide, water vapour or a mixture or compound of these gases.

8. A method as defined in claim 1, wherein said gas flow is laden additionally with a doping material from the third or fifth group of the Periodic System.

9. A method as defined in claim 1, wherein said stream of gas is laden additionally with particles of silicon powder.

10. A method as defined in claim 1, wherein said stream of gas is laden additionally with particles of carbon powder.

11. A method as defined in claim 1, wherein said silicon is deposited on to a monocrystalline silicon surface.

12. A method as defined in claim 1 wherein said silicon is deposited on a metallically conductive surface.

13. A method as defined in claim 12 wherein the metallically conductive surface comprises a metal surface or a metallically conductive layer.

14. A method as defined in claim 1, wherein said silicon is deposited on to an insulator surface.

15. A method as defined in claim 1, wherein said silicon is deposited on to a liquid surface which does not react chemically with silicon.

16. A method as defined in claim 15, wherein said liquid is selected from liquid $MgCl_2$ or lead at 750° C.

17. A method according to claim 1, wherein said silicon is precipitated on to a heated carrier coated with a thin fluid film which does not react with silicon, e.g. an NaF film, or a tin film.

18. A method as defined in claim 17, wherein said heated carrier comprises graphite or ceramics heates to 1,000° C.

19. A method as defined in claim 17, wherein said thin fluid film comprises NaF or tin.

20. A method as defined in claim 1, wherein the silicon is deposited or precipitated in an atmosphere free of oxygen.

21. A method as defined in claim 1, wherein said stream of gas flows with the silicon into a chamber which is at reduced pressure or a vacuum; and said silicon is deposited or precipitated in said reduced pressure or vaccum.

22. A method as defined in claim 1, wherein said silicon is produced in monocrystalline or polycrystalline form.

23. A method as defined in claim 1, wherein said silicon is produced in monocrystalline or polycrystalline plates or layers.

24. A method as defined in claim 1, wherein said silicon is produced in a form suitable for use in producing solar cells.

25. A method as defined in claim 1, wherein said silicon is provided with p-regions, n-regions and p/n-junctions.

26. A method as defined in claim 1, wherein said silicon is produced in powder form.

27. A method as defined in claim 1, wherein a plasma arc of a gas-stabilized plasma injection system or plasma welding system is used as said plasma.

28. A method as defined in claim 1, wherein a plasma arc of a water-stabilized plasma injection system is used as said plasma.

29. A method as defined in claim 1, wherein a plasma injection system with two electrodes is used with at least one electrode manufactured from silicon.

30. A method as defined in claim 1, wherein a plasma injection system with electrodes comprising doped silicon is used and the silicon produced by reduction in said plasma and the silicon of said electrodes have the same type of conductivity.

31. A method as defined in claim 30, wherein the material vaporizing from said electrodes is used to dope the silicon produced in said plasma.

32. A method as defined in claim 1, wherein said moulded element is a quartz rod or a quartz filament or a quartz tube and said moulded element is introduced into the high-temperature region of said plasma to melt away the inserted end of said moulded element continuously and to vaporize said inserted end and to reduce said inserted end to form silicon.

33. A method as defined in claim 1, wherein said moulded element is a rod or tube produced from pressed or sintered SiO or $SiO_2$ powder.

34. A method as defined in claim 1, wherein said moulded element introduced is produced from a powdered mixture of carbon or a carbon compound and quartz.

35. A method as defined in claim 1, wherein a small quantity of an element or a compound of an element from the third or fifth group of the Periodic System is added to the silicon oxide for the purpose of doping the silicon.

36. A method as defined in claim 1, wherein the plasma is produced in a non-oxidizing stream of gas.

37. A method as defined in claim 36, wherein said stream of gas comprises one or more gases selected from the group consisting of inert gas, hydrogen, nitrogen, carbon monoxide, hydrocarbon, hydrogen halides, ammonia, hydrogen sulphides and water vapour.

38. A method as defined in claim 1, wherein said gas flow with said plasma is enveloped by a covering layer of burning or nonburning buffer gas.

39. A method as defined in claim 38 wherein the buffer gas comprises hydrocarbon gas, hydrogen gas, inert gas or nitrogen.

40. A method as defined in claim 1, wherein said stream of gas is located with said plasma in a chamber having an oxygen-free atmosphere.

41. A method as defined in claim 1, wherein said stream of gas with said plasma flows into reduced pressure chamber.

42. A method as defined in claim 1, wherein the silicon produced with the aid of said plasma is precipitated on to a substrate in the form of a polycrystalline or monocrystalline silicon layer.

43. A method as defined in claim 1, wherein the silicon produced is used to produce silicon solar cells.

* * * * *